US007002420B2

(12) United States Patent
Ngo

(10) Patent No.: US 7,002,420 B2
(45) Date of Patent: Feb. 21, 2006

(54) INTERLEAVED VCO WITH BODY VOLTAGE FREQUENCY RANGE CONTROL

(75) Inventor: Hung C. Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 10/763,093

(22) Filed: Jan. 22, 2004

(65) Prior Publication Data

US 2005/0168295 A1    Aug. 4, 2005

(51) Int. Cl.
H03B 27/00    (2006.01)
(52) U.S. Cl. .......................................... 331/57; 331/45
(58) Field of Classification Search ................. 331/57, 331/45, 74; 327/158, 159
See application file for complete search history.

(56) References Cited

U.S. PATENT DOCUMENTS

| | | | |
|---|---|---|---|
| 4,517,532 A * | 5/1985 | Neidorff ....................... 331/57 |
| 5,434,525 A * | 7/1995 | Leonowich ................. 327/278 |
| 5,668,505 A * | 9/1997 | Vu et al. ....................... 331/49 |
| 5,912,591 A | 6/1999 | Yamada ....................... 331/57 |
| 6,133,799 A | 10/2000 | Favors, Jr. et al. ........... 331/57 |
| 6,353,369 B1 * | 3/2002 | Boerstler ...................... 331/57 |
| 2003/0071691 A1 * | 4/2003 | Boerstler et al. ............. 331/57 |

* cited by examiner

*Primary Examiner*—Joseph Chang
(74) *Attorney, Agent, or Firm*—Richard F. Frankeny; Winstead Sechrest & Minick P.C.; Casimer K. Salys

(57) ABSTRACT

An interleaved VCO is configured using a ring oscillator with voltage controlled feedforward inverting stages coupled around the inverting stages making up the basic ring oscillator to enable the frequency of the ring oscillator to be voltage controlled. The feedforward inverting stages comprise a complementary inverter stage and a voltage controlled transfer gate. Complementary control voltages are coupled to the gates of the complementary transfer gate FET devices. Likewise, the complementary control voltages are coupled to the corresponding body of the FET devices in the transfer gate and in the inverting stage. The complementary control voltages may also be connected to the body of the complementary FET devices in the inverting stages making up the basic ring oscillator. This allows the frequency range of the VCO to be extended without having to switch the feedforward paths into an out of the circuit.

39 Claims, 10 Drawing Sheets

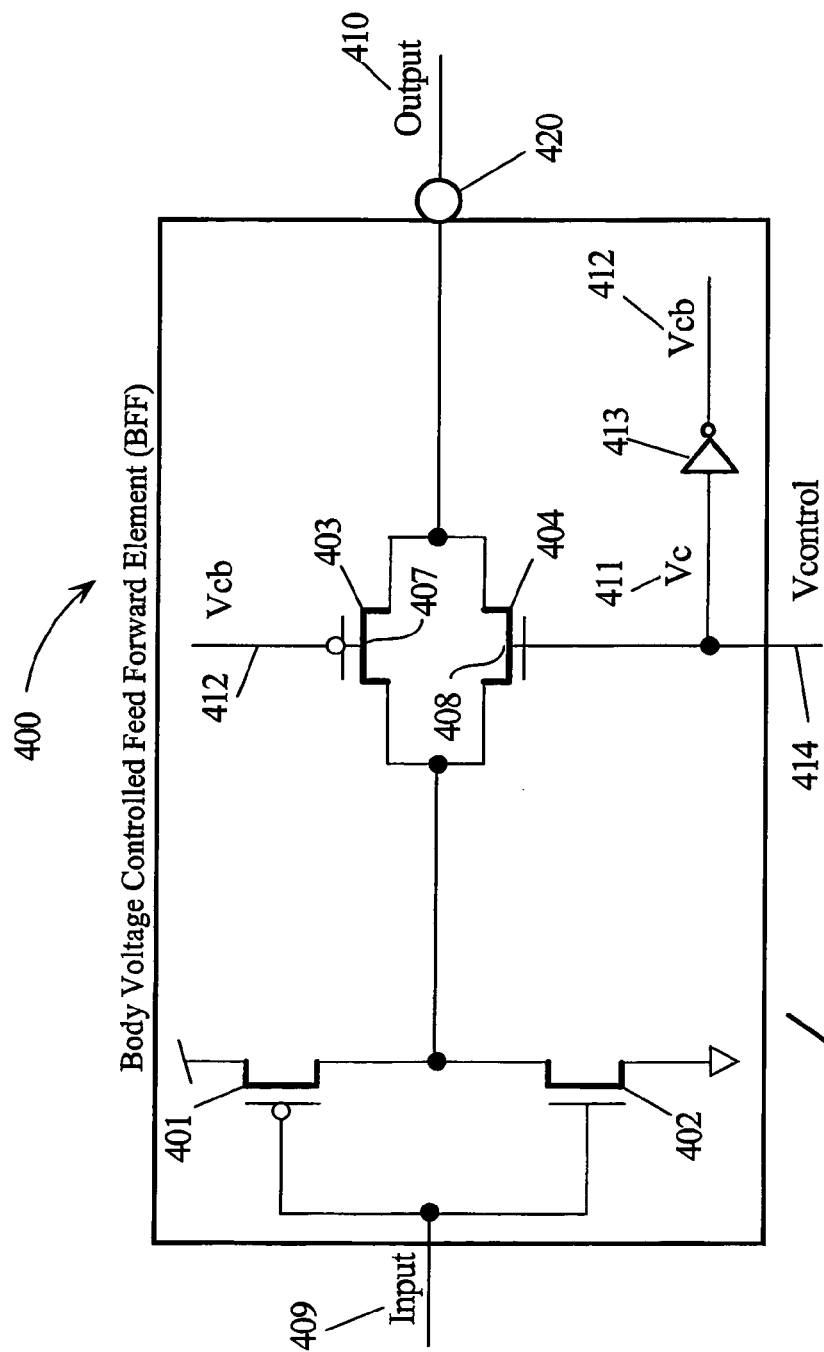
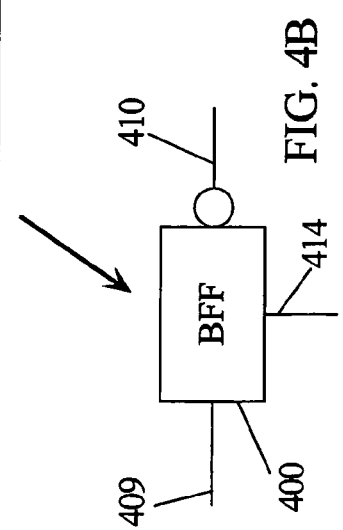
FIG. 4A
FIG. 4B

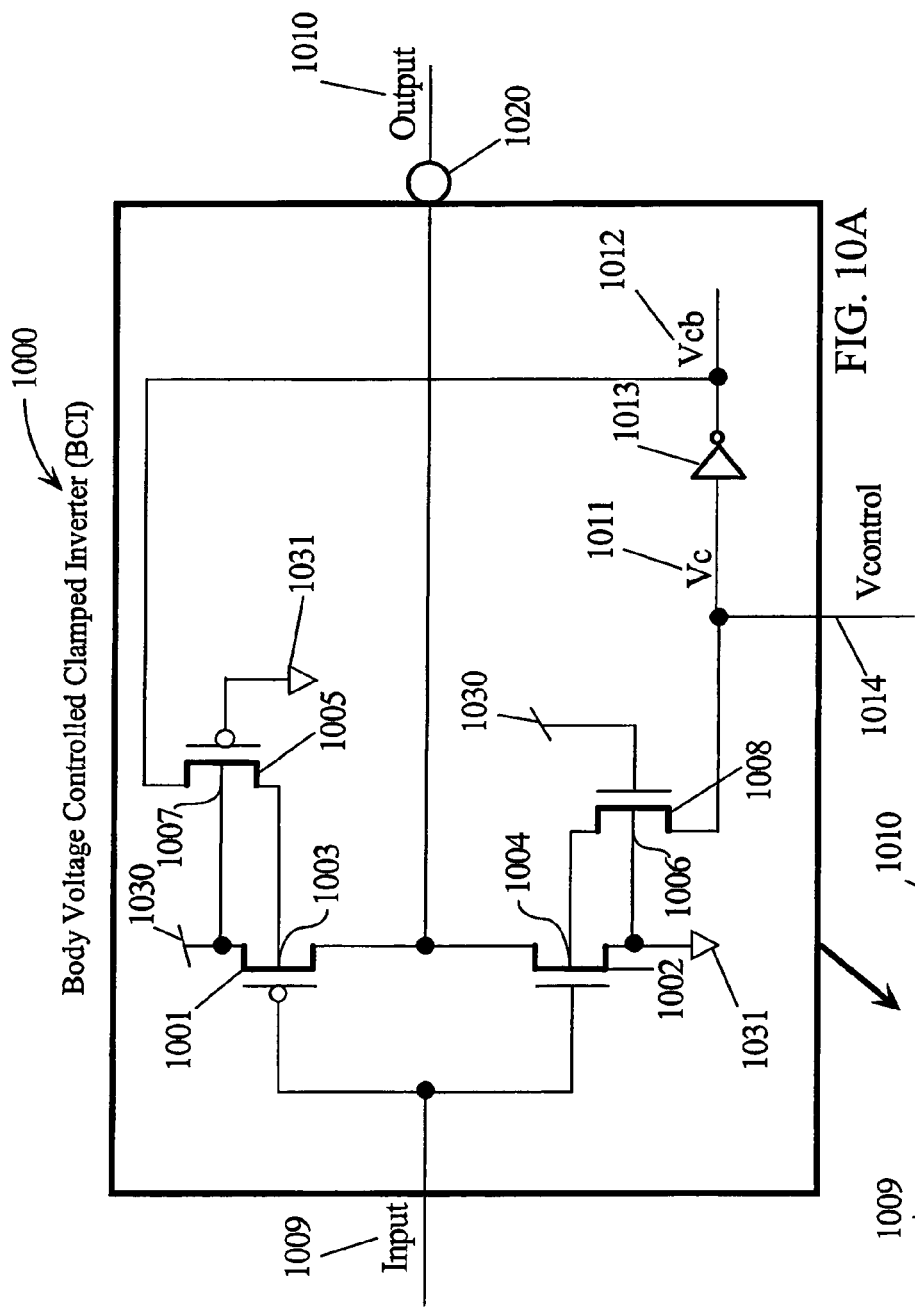
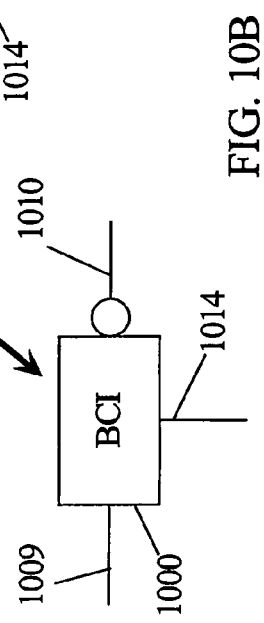
FIG. 10A
FIG. 10B

INTERLEAVED VCO WITH BODY VOLTAGE FREQUENCY RANGE CONTROL

CROSS REFERENCE TO RELATED APPLICATION

The present invention is related to the following U.S. Patent Application which is incorporated herein by reference:

Ser. No. 10/718,062 entitled "VOLTAGE CONTROLLED OSCILLATOR WITH SELECTABLE FREQUENCY RANGES" filed Nov. 22, 2003.

TECHNICAL FIELD

The present invention relates in general to voltage controlled oscillators (VCOs) comprising a ring oscillator circuitry and in particular to VCOs with ring oscillator circuitry using complementary metal oxide semiconductor (CMOS) field effect transistors (FETs) circuitry.

BACKGROUND INFORMATION

Phase-locked loops (PLL's) have been widely used in high-speed communication systems because PLL's efficiently perform clock recovery or clock generation at a relatively low cost. Dynamic voltage and frequency scaling is a critical capability in reducing power consumption of power sensitive devices. Scaling, in this sense, means the ability to select high performance with nominal power supply voltages and high frequency clock operation or low performance by reducing the power supply voltage and corresponding the clock frequency. Reducing the system power is usually done when performance is not needed or when running from a limited energy source such as a battery. To allow low power operation, the PLL and other circuits must support very aggressive power/energy management techniques. For the PLL, this means low power operation while supporting key required features such as dynamic frequency scaling, dynamic voltage scaling, clock freezing and alternate low frequency clocking. Dynamic implies that the PLL is able to support changes in the output frequency and logic supply voltage without requiring the system to stop operation or waiting for the PLL clock to reacquire lock.

Using a PLL or delay-locked loop (DLL) has advantages in a battery powered system because a PLL is able to receive a lower frequency reference frequency from a stable oscillator to generate system clock frequencies. A PLL also allows changing the system clock frequency without changing the reference frequency. The prior art has described ways of selecting operating points of voltage and frequency statically, for example, stopping execution while allowing the PLL to frequency lock to a new frequency. This slows system operations and complicates system design.

One of the key circuits in a PLL is a voltage-controlled oscillator (VCO). Circuits in the PLL generate an error voltage that is coupled to the VCO to control the frequency of the VCO output. By frequency dividing the output of the PLL and feeding it back and comparing it to a low frequency crystal-controlled reference clock, a stable high frequency clock may be generated. The VCO in a PLL typically has a range over which the frequency of the VCO may be voltage controlled. In systems employing frequency scaling, it is desirable to have a voltage-controlled frequency range for normal voltage operation and another voltage-controlled frequency range for low voltage operation without resorting to two VCOs.

VCO circuits employ ring oscillators comprising an odd number M of inverters in a string or sequence from the basic oscillator block. A transition on the input of the ring oscillator emerges at the output after a delay equal to the sum of the delay through the inverters. This is equal to one half the period of the basic oscillator frequency. By coupling a voltage controlled inverting circuit around inverting stages, the basic oscillator frequency may be modified. This allows a common control voltage to vary the basic frequency thus forming a VCO circuit. If larger changes in frequency are desired, then the odd number M of inverters may be varied by selecting which inverter is the output to feedback to the input. This results in a VCO circuit that has a wider range than is possible with a fixed number of M inverters in a ring oscillator, however, it requires logic to provide glitch free switching. Providing circuitry for extending the range of delay of the voltage controlled inverting circuit and the inverters forming the basic ring oscillator without requiring the glitch free logic would allow an extended range interleaved VCO in a single circuit configuration.

There is, therefore, a need for a wide range VCO circuit that provides for an extended range of frequency control without changing the number of inverters bypassed by the voltage controlled inverting circuit or requiring the glitch free switching logic.

SUMMARY OF THE INVENTION

A wide range interleaved VCO is formed by having a ring oscillator formed with an odd number of series coupled inverters. An odd number of the series inverters are bypassed by a voltage controlled inverting circuit. The voltage controlled inverting circuit comprises an inverter and a transfer gate with complementary P channel and N channel FET devices controlled by complementary control voltages. In one embodiment of the present invention, the complementary voltages are coupled to a terminal on the corresponding PFET and NFET of the transfer gate connected to the body of each of the FET devices. Likewise, the complementary voltages are coupled to the corresponding gate terminals of the FET devices. This allows the delay modified by the transfer gate delay to have a wider control range. In another embodiment, the complementary control voltages are coupled to the corresponding PFETs and NFETs in the primary string of series coupled inverters in the ring oscillator for additional frequency control range.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A and 4B are circuit diagrams of another body voltage controlled feedforward element according to embodiments of the present invention;

FIGS. 10A and 10B are circuit diagrams of a body voltage controlled clamped inverter (BCI) configured for use with embodiments of the present invention.

DETAILED DESCRIPTION

Figure 1:
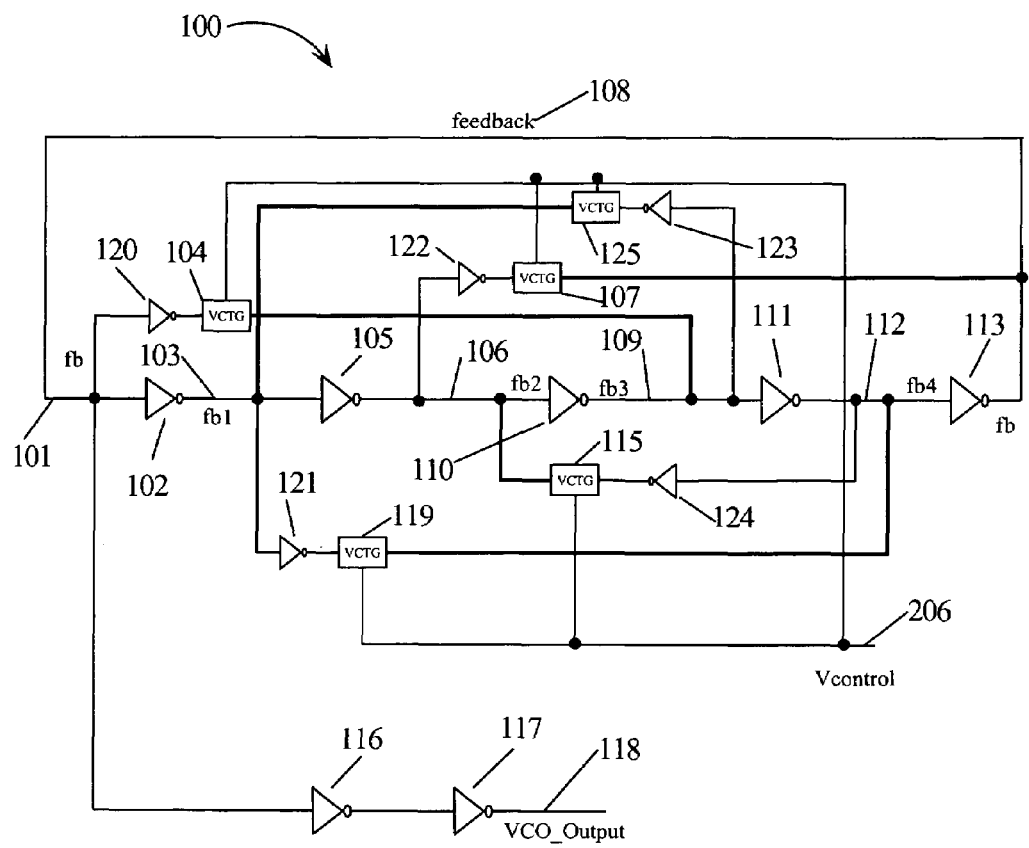
FIG. 1 is a block diagram of a voltage-controlled oscillator (VCO) using a feedforward element which is varied with a control voltage.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
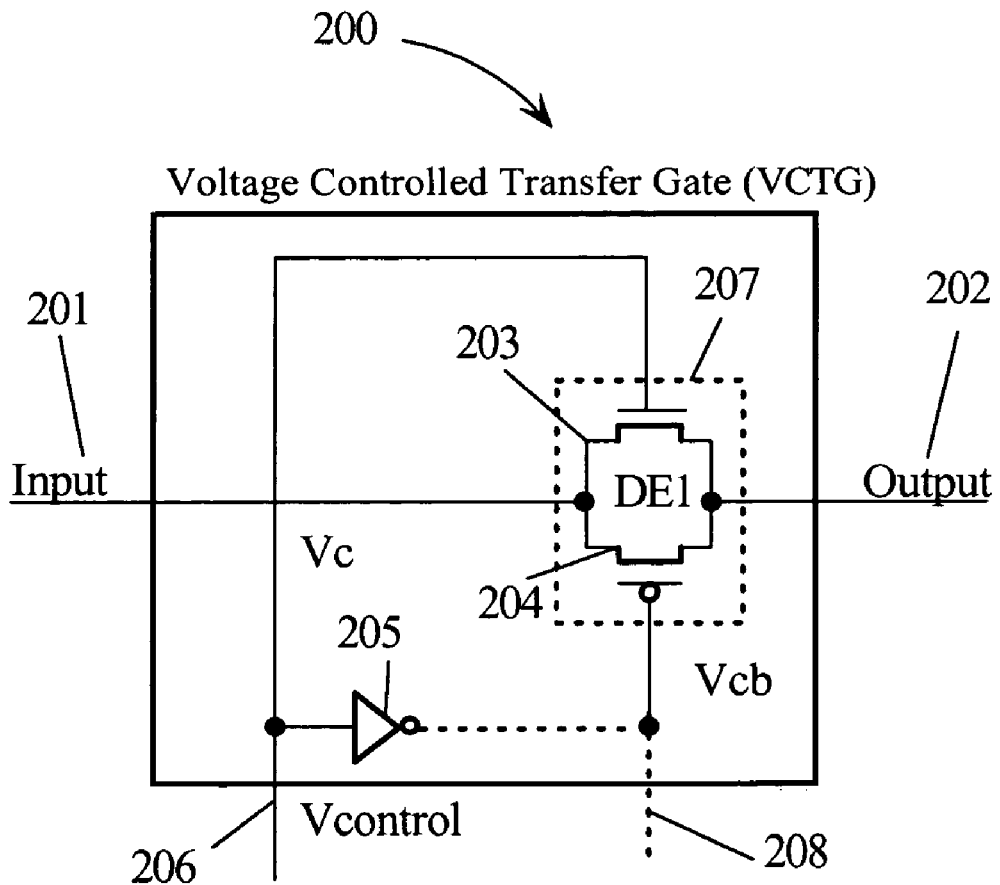
FIG. 2 is a circuit diagram of a voltage controlled transfer gate that may be used in a feedforward element.

FIG. 2 is a circuit diagram of a voltage controlled transfer gate 200 having an input 201 and an output 202 and employed as a delay element used in embodiments of the present invention. Transfer gate 207 is controlled by opposing control voltages Vc 206 and Vcb 208 generated by inverting circuit 205. Although transfer gates are normally used for bi-directional switches, varying the gate voltages of the parallel devices varies their conductance. VCTG 207 shows an exemplary circuit comprising parallel N channel field effect transistor (NFET) 203 and P channel FET (PFET) 204. In general, a VCTG may generate the complementary voltages 206 and 208 locally using an inverting circuit 205 or they may be generated in a common circuit and distributed as complementary voltages. A signal on input 201 is delayed to output 202 by varying the conductance of transfer gate 207 using control voltages Vc 206 and Vcb 208.

FIG. 1 is a circuit diagram of a voltage-controlled oscillator (VCO) 100 using a feedforward configuration. Inverters 102, 105, 110, 111, and 113 are connected in series, output to input, generating a ring of five inverters where the output of the fifth inverter 113 is connected back to the input of the first inverter 102. Inverters 102, 105, 110, 111, and 113 form the primary path of VCO 100. Feedforward elements (voltage controlled transfer gates (VCTG)) 104, 119, 107, 125, and 115 (e.g., VCTG 200) are coupled between nodes of the primary path using inverters 120–124, respectively. If VCTGs 104, 107, 115, and 119 are not conducting (controlled by Vcontrol 206), then VCO 100 operates at its lowest frequency. If the VCTGs 104, 119, 107, 115, and 125 are biased ON, they will conduct a current signal to a corresponding following inverter in proportion to the magnitude of the control voltage Vcontrol 206. Feedback 108 is the connection of the output of inverter 113 back to the input of inverter 102 forming node fb 101. Inverters 116 and 117 perform the function of reshaping the signal on node fb 101 as the VCO_Output 118.

The circuit connection of the inverters and transfer gates in FIG. 1 results in a normal propagation path and a parallel feedforward path. For example, the feedforward path including VCTG 104 is in parallel with the series connection of inverters 103, 105 and 110 (from fb 101 to fb3 109). A signal transition on fb 101 will result in a corresponding opposite transition on node fb3 208 at a delay time determined by the delay of primary path inverters 103, 105 and 110. At the time of a transition on fb 101, fb3 109 will be static awaiting the transition through inverters 103, 105 and 110. If VCTG 104 is in an ON state as determined by the level of Vc 206, then the path through inverter 120 and VCTG 104 will result in the transition occurring earlier. This speeds up the primary path and causes VCO 100 to have a higher frequency. All the feedforward paths comprising inverter 120 and VCTG 104, inverter 121 and VCTG 119, inverter 122 and VCTG 107, inverter 124 and VCTG 115, and inverter 123 and VCTG 125 operate in the same fashion. As control voltages Vc 206 is varied, the VCTG circuits 104, 119, 107, 115 and 125 may be operated from a point of cutoff where no conduction occurs to one of saturation where conduction is no longer affected by control voltages Vc 206.

Figure 3A:
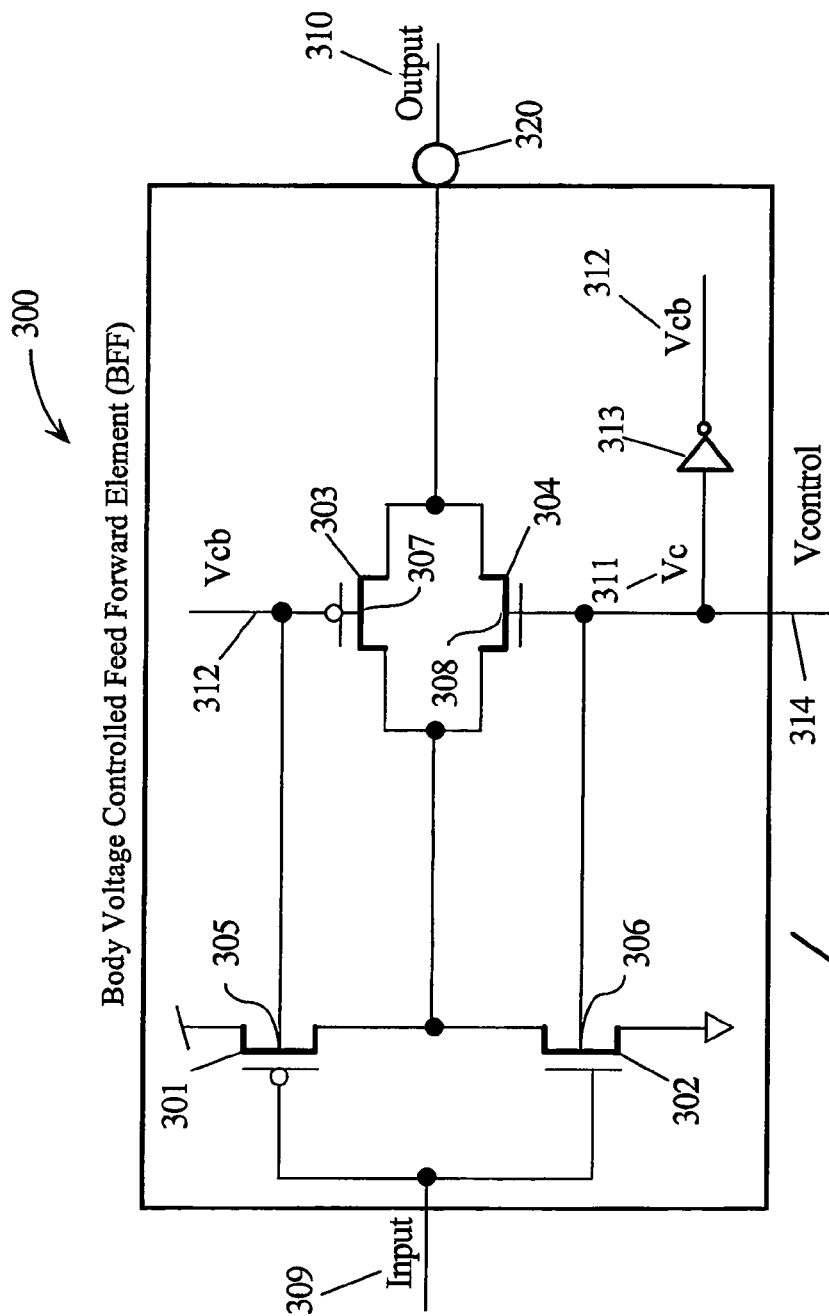
FIGS. 3A and 3B are circuit diagrams of a body voltage controlled feedforward element according to embodiments of the present invention.

FIG. 3A is a circuit for a body voltage controlled feedforward element (BFF) according to embodiments of the present invention. The voltage applied to the bulk or body contact affects the threshold voltage of a MOSFET. The voltage difference between the source and the bulk, $V_{BS}$, changes the width of the depletion layer and therefore also the voltage across the oxide due to the change of the charge in the depletion region. If the FET devices are manufactured as a silicon on insulator (SOI), the bulk area or body for a group of devices may be isolated such that the body voltage of selected devices may be modified. This would allow the threshold of a group of devices to be selectively modified with a control voltage applied to the body of the group of devices.

Figure 3B:
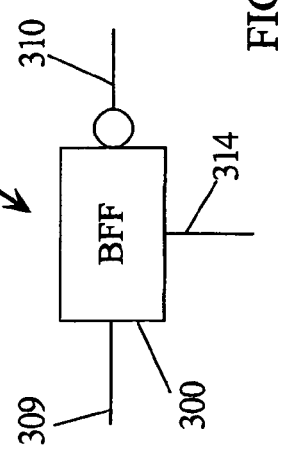

PFETs 301 and 303 have body electrodes 305 and 307 coupled to the body semiconductor used to form their field effect structure. Likewise, NFETs 302 and 304 have a corresponding body electrodes 306 and 308. The body electrodes are coupled to complementary voltages Vc 311 and Vcb 312. These voltages have the same nominal voltage level, however when varied they move in opposing directions. Control voltages Vc 311 and Vcb 312 maybe be generated locally or distributed as complementary voltages. Element 320 is used to indicate that the BFF 300 has a basic inverting functionality. FIG. 3B illustrates a circuit symbol used for a BFF 300 with input 309, output 310 and control terminal 314.

FIGS. 4A and 4B illustrate another BFF 400 according to embodiments of the present invention. In this embodiment only the transfer gate portion of BFF 400 is coupled to the control voltage 414. FIG. 4B illustrates a circuit symbol for a BFF 400 which may be used in additional drawings.

Figure 5:
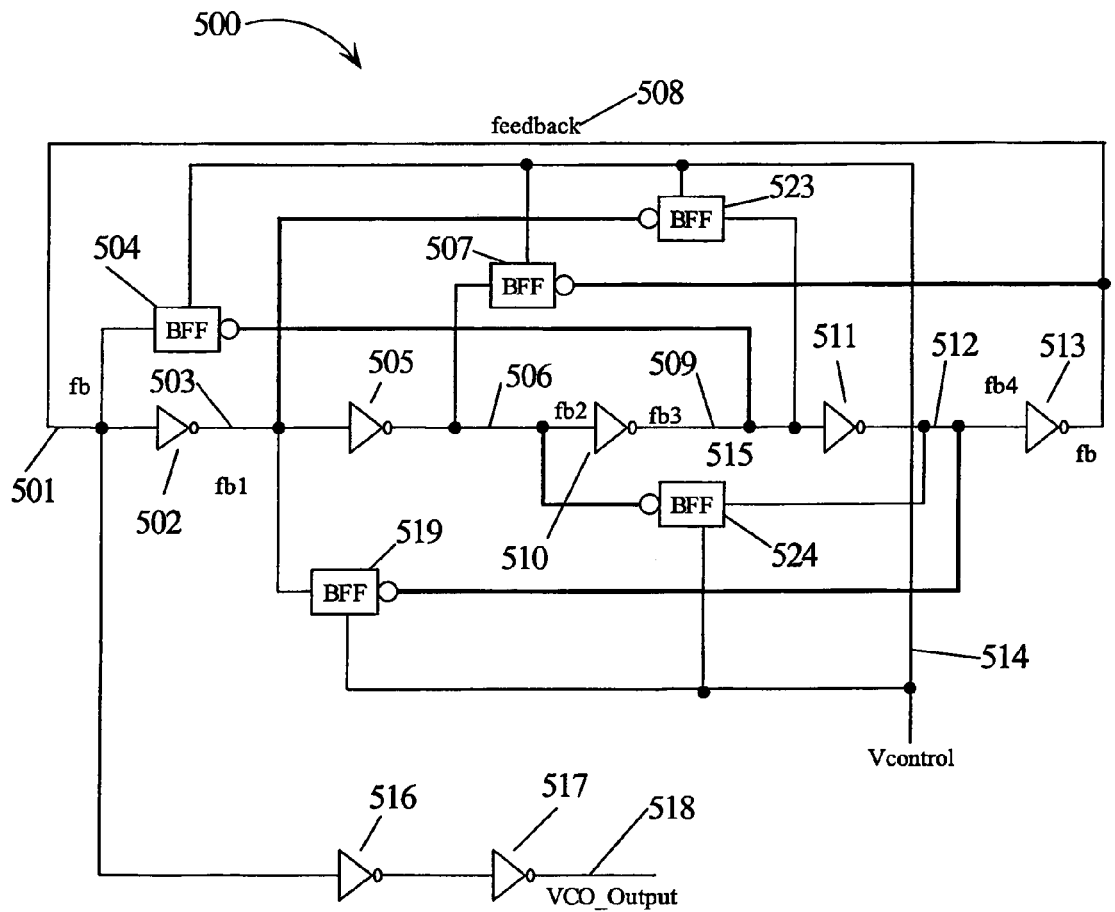
FIG. 5 is a circuit diagram of an interleaved VCO with extended frequency range according to embodiments of the present invention.

FIG. 5 is a circuit diagram of an interleaved VCO 500 according to embodiments of the present invention. VCO 500 has a main inverter path comprising inverters 502, 505, 510, 511 and 513. Selected odd numbers of inverter are bypassed by a BFF 300 or BFF 400 (BFF 504, 507, 519, 523 and 524) to form an interleaved VCO 500 with extended frequency control range.

Figure 6:
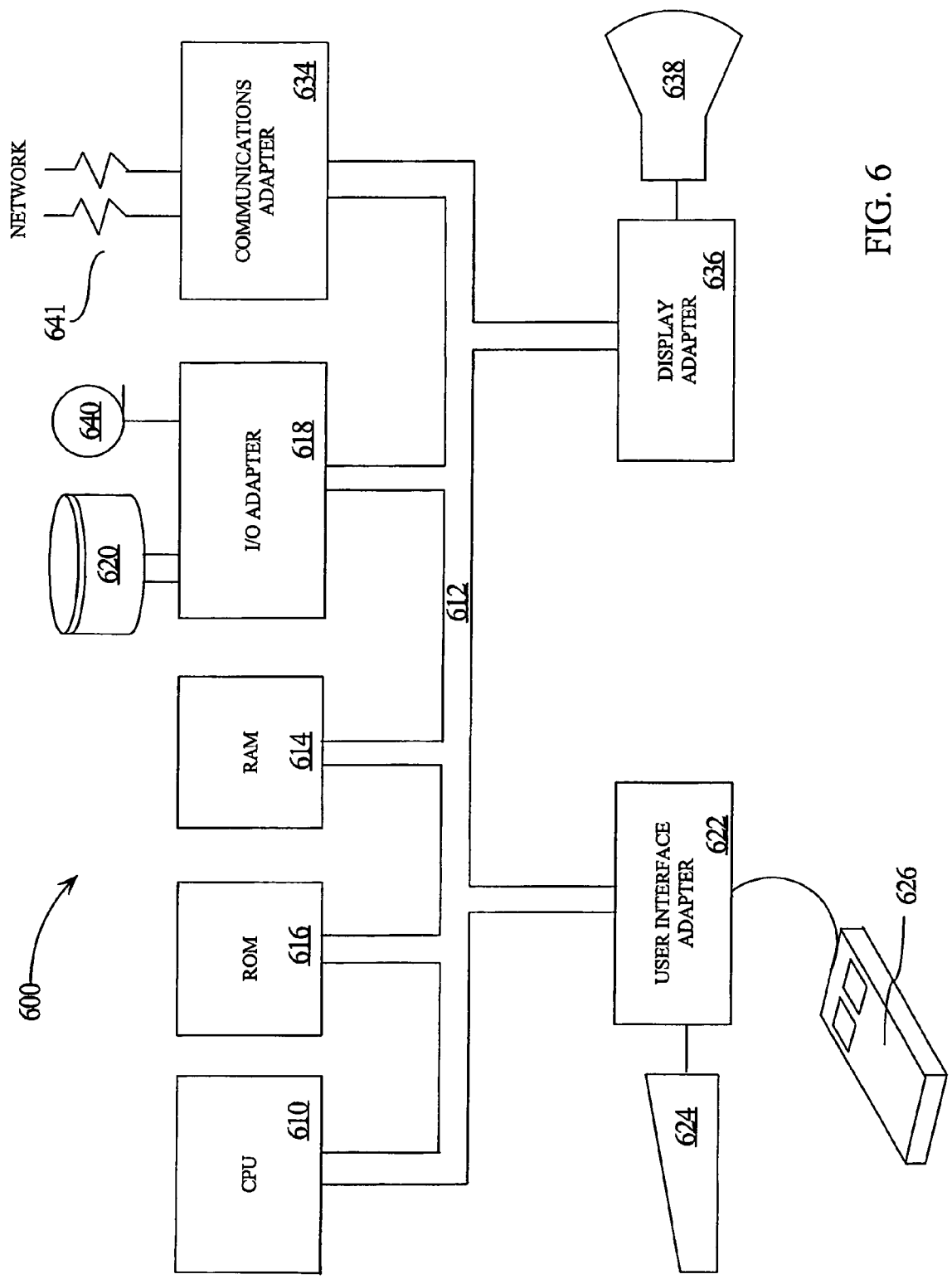
FIG. 6 is a block diagram of a data processing system suitable to use embodiments of the present invention for clock generation.

FIG. 6 is a high level functional block diagram of a representative data processing system 600 suitable for practicing the principles of the present invention. Data processing system 600, includes a central processing system (CPU) 610 operating in conjunction with a system bus 612. System bus 612 operates in accordance with a standard bus protocol, such as the ISA protocol, compatible with CPU 610. CPU 610 operates in conjunction with electronically erasable programmable read-only memory (EEPROM) 616 and random access memory (RAM) 614. Among other things, EEPROM 616 supports storage of the Basic Input Output System (BIOS) data and recovery code. RAM 614 includes, DRAM (Dynamic Random Access Memory) system memory and SRAM (Static Random Access Memory) external cache. I/O Adapter 618 allows for an interconnection between the devices on system bus 612 and external peripherals, such as mass storage devices (e.g., a hard drive, floppy drive or CD/ROM drive), or a printer 640. A peripheral device 620 is, for example, coupled to a peripheral control interface (PCI) bus, and I/O adapter 618 therefore may be a PCI bus bridge. User interface adapter 622 couples various user input devices, such as a keyboard 624 or mouse 626 to the processing devices on bus 612. Display 638 which may be, for example, a cathode ray tube (CRT), liquid crystal display (LCD) or similar conventional display units. Display adapter 636 may include, among other things, a conventional display controller and frame buffer memory. Data processing system 600 may be selectively coupled to a computer or telecommunications network 641 through communications adapter 634. Communications adapter 634 may include, for example, a modem for connection to a telecom network and/or hardware and software for connecting to a computer network such as a local area network (LAN) or a wide area network (WAN). CPU 610 and other components of data processing system 600 may contain a PLL loop for generating clocks which operate with an interleaved VCO 500 or 800 according to embodiments of the present invention.

Figure 7:
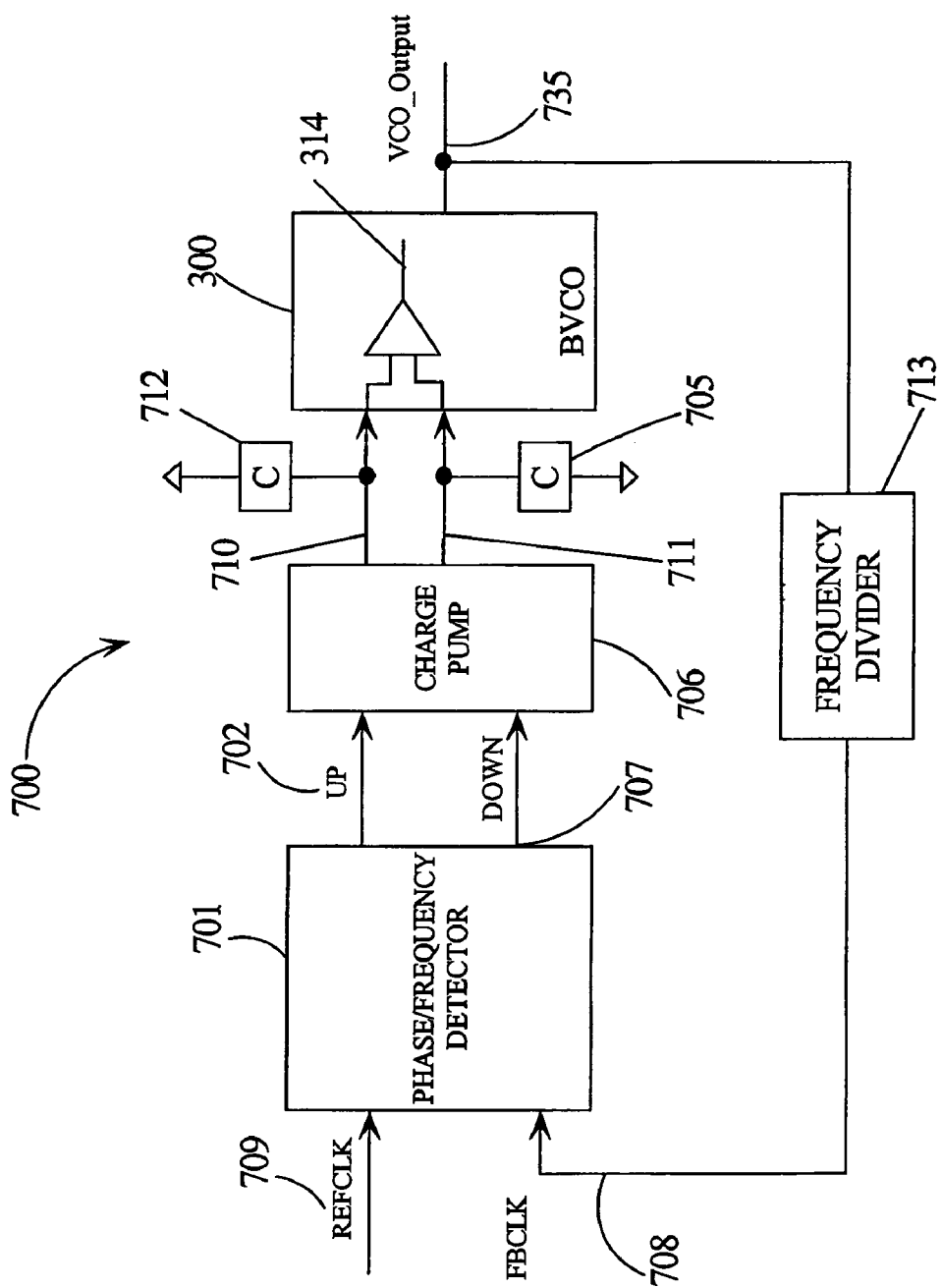
FIG. 7 is a block diagram of a phase lock loop suitable to use embodiments of the present invention.

FIG. 7 is a block diagram of a representative phase lock loop circuit 700 suitable for practicing the principles of the present invention. Reference clock (RCLK) 709 and feedback clock (FBCLK) 708 are compared in phase/frequency detector (PFD) 701 generating UP signal 702 and DOWN signal 707 which are applied as control signals to charge pump 706. UP signal 702 and DOWN signal 707 are used to control current sources in charge pump 706. Charge pump 706 has charge pump nodes 710 and 711. Capacitor 712 is coupled between charge pump node 710 and ground and capacitor 705 is coupled between charge pump node 711 and ground. UP signal 702 and DOWN 707 are generated in response to a lead or lag phase difference between RCLK 709 and FBCLK 708. Since RCLK 709 and FBCLK 708 cannot concurrently have a lead and a lag phase error, UP signal 702 and DOWN 707 are mutually exclusive signals. VCO output 735 is frequency divided by frequency divider 713 generating FBCLK 708. VCO 300 (or VCO 400) are interleaved VCOs with extended frequency control ranges according to embodiments of the present invention. The differential signal between charge pump nodes 710 and 711 may be used directly or converted to a single ended control voltage 314 to control the frequency of VCO 300 (or 400) within a frequency range.

Figure 8:
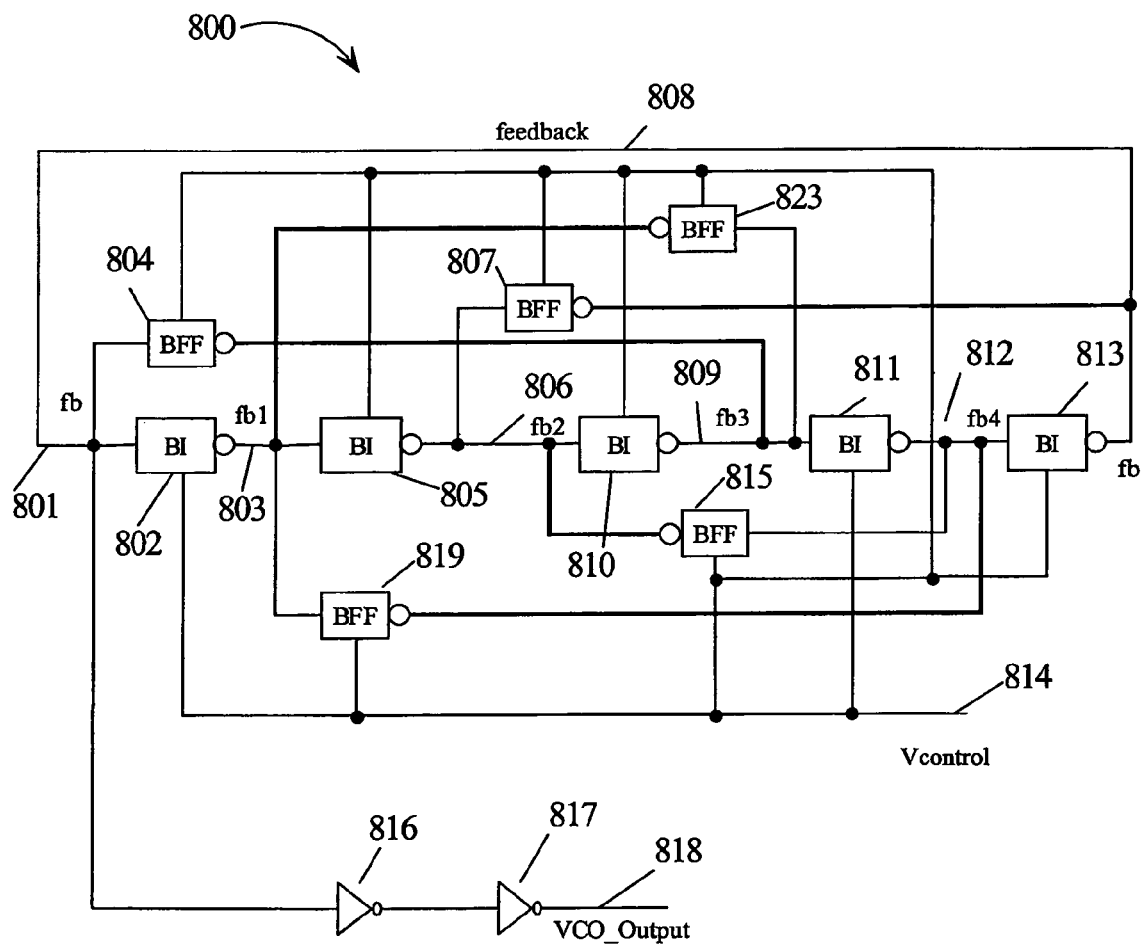
FIG. 8 is a circuit diagram of another interleaved VCO with extended frequency range according to embodiments of the present invention.

FIG. 8 is a circuit diagram of an interleaved VCO 800 according to another embodiment of the present invention.

VCO 800 has a main inverter path comprising body voltage controlled inverters (BIs) 802, 805, 810, 811 and 813. Selected groups comprising odd numbers of BIs selected from BIs 802, 805, 810, 811 and 813 are bypassed by a BFF 300 or BFF 400 (BFF 804, 807, 819, 823 and 815) to form an interleaved VCO 800 with extended frequency control range.

Figure 9A:
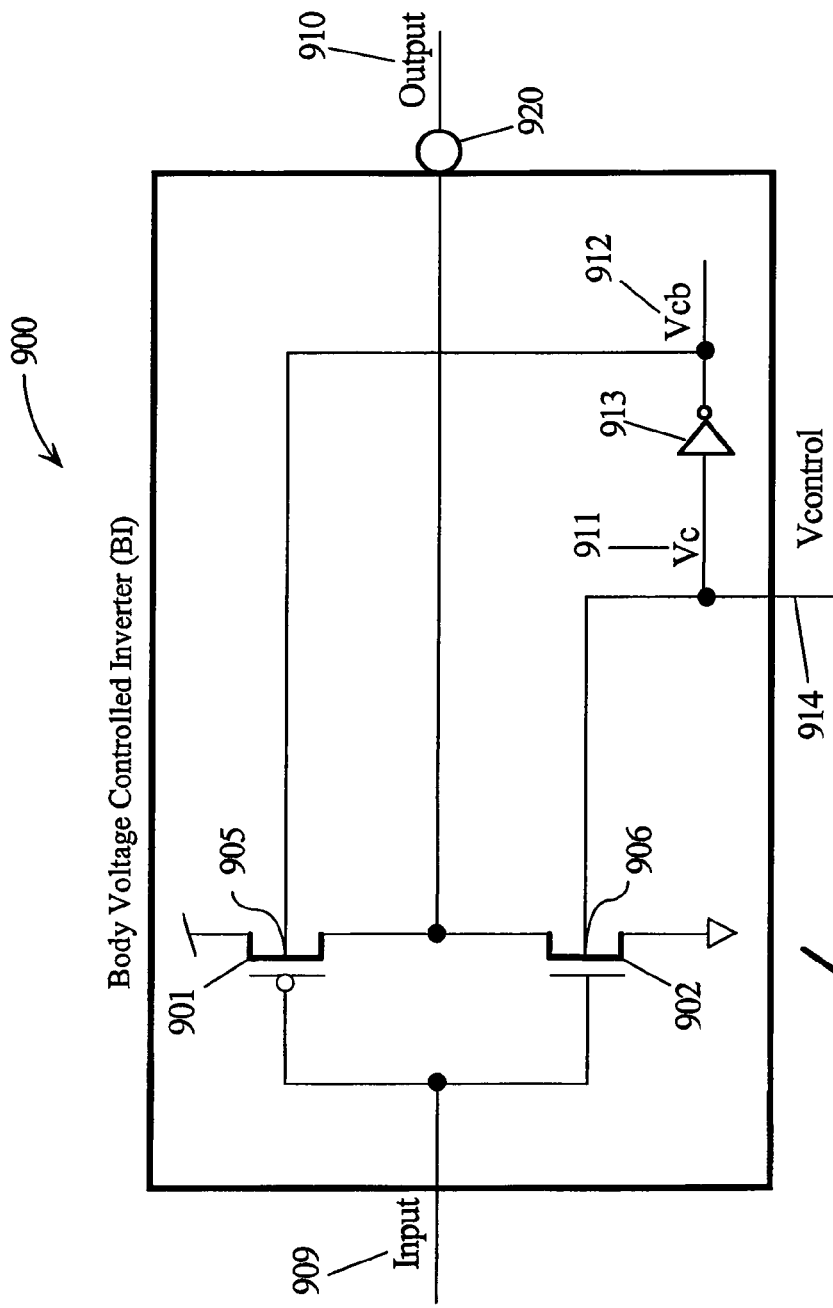
FIGS. 9A and 9B are circuit diagrams of a body voltage controlled inverter (BI) according to embodiments of the present invention.
Figure 9B:
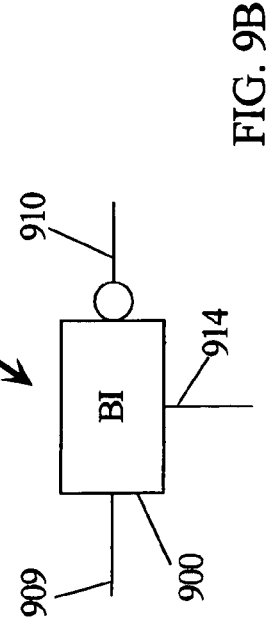

FIG. 9A is a circuit diagram of a body voltage controlled inverter (BI). PFET 901 has a body electrode 905 coupled to control voltage Vcb 912 and NFET 902 has body electrode 906 coupled to Vc 911. In this embodiment, an inverting stage generates complementary voltage Vcb 912 from Vc 911. FIG. 9B illustrates a circuit symbol used for BI devices (e.g., BI 802, 805, 810, 811, and 813) in FIG. 8.

FIG. 10A is a circuit diagram of a body voltage controlled clamped inverter (BCI) configured for use with embodiments of the present invention. In cases when the control voltages Vc 1011 and Vcb 1012 may vary from the positive power supply voltage (VDD) 1030 to the negative power supply voltage (GND) 1031 and the power supply voltage VDD is greater than 0.7 V (diode turn-on voltage), precautions may be necessary to prevent the diode (not shown) isolating the body region from becoming forward biased. Normally the body region is coupled to the most positive voltage for PFETs and the most negative voltage for NFETs. However, where the body voltage of the PFETs are varied all the way to zero voltage for control, the body diode becomes forward biased. The circuit of FIG. 10 assures the body to VDD voltage is less than approximately 0.7 volts by one threshold potential (Vt) for both the NFET 1002 and the PFET 1001. If VDD is greater than approximately 0.7 volts and Vc 1011 and Vcb 1012 vary from VDD to GND, then other circuit modifications may be necessary.

In FIG. 10A, NFET 1008 has its gate coupled to VDD 1030 and its drain coupled to the body of NFET 1002, connection 1004. The source of NFET 1008 is coupled to Vc 1011. The body of NFET 1008 is coupled back to GND 1031, connection 1006. Likewise, PFET 1005 has its gate coupled to GND 1031, its source coupled to Vcb 1012, and its drain coupled to the body of PFET 1001, connection 1003. The body of PFET 1005 is coupled to VDD 1030, connection 1007. This circuit configuration prevents the body voltage of PFET 1001 from going all the way to GND 1031 when Vcb 1012 goes to zero volts. Likewise, the circuit of FIG. 10A prevents the body voltage of NFET 1002 from going all the way to the positive supply voltage when Vc 1011 goes to the voltage of VDD 1030. FIG. 10B illustrates a circuit symbol used for BCI 1000 if used in other circuit diagrams. A BCI 1000 device may be substituted for each of BI 802, 805, 810, 811, and 813 in the embodiment of the present invention illustrated in FIG. 8. Also, the inverter comprising PFET 301 and NFET 302 in FIG. 3 may be replaced by a BCI 1000 circuit comprising PFETS 1001 and 1005 and NFETS 1002 and 1008. Vc 1011 and Vcb 1012 may be generated from a single control voltage Vcontrol 1014 using inverting circuit 1013 within BCI 1000 or generated remotely.

Although the present invention and its advantages have been described in detail, it should be understood that various changes, substitutions and alterations can be made herein without departing from the spirit and scope of the invention as defined by the appended claims.

What is claimed is:

1. A voltage controlled oscillator (VCO) comprising a ring oscillator having an input, an output, an odd number M of complementary metal oxide semiconductor (CMOS) inverters series coupled between the input and output, a feedback connection between the input and output, and a number K of voltage controlled feed-forward (FF) stages, each of the K FF stages coupled in parallel with K groups of an odd number of G sequential CMOS inverters selected from the M CMOS inverters, each of the K FF stages having a plurality P channel metal oxide silicon transistors (PFETs) and a plurality of N channel metal oxide silicon transistors (NFETs), at least one of the PFETs having a first isolated region of semiconductor material (body) connected to a first body terminal, and at least one of the NFETs having a second isolated body connected to a second body terminal, wherein the K FF stages are controlled by first and second control voltages coupled to the first and second body terminals respectively, wherein each of the K FF stages comprises a CMOS inverter stage coupled in series with a transfer gate stage having a parallel connection of a first PFET and a first NFET, and wherein each of the CMOS inverters in the K FF stages comprise a second PFET and a second NFET coupled in series, wherein the second PFET of at least one of the CMOS inverters has a body terminal coupled to the first control voltage by a first clamping circuit preventing a body diode coupled to the body terminal of the second PFET from being forward biased and the second NFET of the at least one of the CMOS inverters has a body terminal coupled to the second control voltage by a second clamping circuit preventing a body diode coupled to the body terminal of the second NFET from being forward biased.

2. The VCO of claim 1, wherein the first PFET of the transfer gate stage has a body terminal coupled to the first control voltage and the NFET of the transfer gate a body terminal coupled to the second control voltage.

3. The VCO of claim 2, wherein each of M CMOS inverters comprise a second PFET and a second NFET coupled in series, wherein the second PFET of at least one of the CMOS inverters has a body terminal coupled to the first control voltage by a first clamping circuit preventing a body diode coupled to the body terminal of the second PFET from being forward biased and the second NFET of the at least one of the CMOS inverters has a body terminal coupled to the second control voltage by a second clamping circuit preventing a body diode coupled to the body terminal of the second NFET from being forward biased.

4. The VCO of claim 3, wherein the first clamping circuit comprises a clamping PFET having a body terminal coupled to the source of the second PFET, a gate coupled to ground potential, a drain coupled to the body terminal of the second PFET and a source coupled to the first control voltage and the second clamping circuit comprises a clamping NFET having a body terminal coupled to the source of the second NFET, a gate coupled to the positive power supply voltage, a drain coupled to the body terminal of the second NFET and a source coupled to the first control voltage.

5. The VCO of claim 2, wherein each of M CMOS inverters comprise a third PFET and a third NFET, wherein the third PFET of at least one of the M CMOS inverters has a body terminal coupled to the first control voltage and the third NFET of the at least one of the M CMOS inverters has a body terminal coupled to the second control voltage.

6. The VCO of claim 1, wherein the second control voltage is derived from the first control voltage such that the first and the second control voltages have a same nominal value and opposite slopes when modified.

7. The VCO of claim 1, wherein each of the CMOS inverters in the K FF stages comprise a second PFET and a second NFET coupled in series, wherein the second PFET of at least one of the CMOS inverters has a body terminal coupled to the first control voltage and the second NFET of the at least one of the CMOS inverters has a body terminal coupled to the second control voltage.

8. The VCO of claim 7, wherein each of M CMOS inverters comprise a third PFET and a third NFET, wherein the third PFET of at least one of the M CMOS inverters has a body terminal coupled to the first control voltage and the third NFET of the at least one of the M CMOS inverters has a body terminal coupled to the second control voltage.

9. The VCO of claim 1, wherein the first clamping circuit comprises a clamping PFET having a body terminal coupled to the source of the second PFET, a gate coupled to ground potential, a drain coupled to the body terminal of the second PFET and a source coupled to the first control voltage and the second clamping circuit comprises a clamping NFET having a body terminal coupled to the source of the second NFET, a gate coupled to the positive power supply voltage, a drain coupled to the body terminal of the second NFET and a source coupled to the first control voltage.

10. The VCO of claim 1, wherein K is equal to M.

11. A phase locked loop (PLL) circuit for generating an output clock signal with a frequency that is a multiple number N times the frequency of a reference clock signal, comprising:

a voltage controlled oscillator (VCO) generating the output clock signal with a frequency modified in response to a control voltage;

a frequency divider for frequency dividing the output clock signal by N, generating a frequency divided clock signal;

a phase frequency detector for comparing the frequency divided clock signal to the reference clock signal and generating a phase/frequency error signal; and circuitry for converting the phase/frequency error signal to the control voltage, wherein the VCO is a ring oscillator having an input, an output, an odd number M of complementary metal oxide semiconductor (CMOS) inverters series coupled between the input and output, a feedback connection between the input and output, and a number K of voltage controlled feed-forward (FF) stages, each of the K FF stages coupled in parallel with K groups of an odd number of G sequential CMOS inverters selected from the M CMOS inverters, each of the K FF stages having a plurality P channel metal oxide silicon transistors (PFETs) and a plurality of N channel metal oxide silicon transistors (NFETs), at least one of the PFETs having a first isolated region of semiconductor material (body) connected to a first body terminal, and at least one of the NFETs having a second isolated body connected to a second body terminal, wherein the K FF stages are controlled by first and second control voltages coupled to the first and second body terminals respectively, wherein each of the K FF stages comprise a CMOS inverter stage coupled in series with a transfer gate stage having a parallel connection of a first PFET and a first NFET, and wherein each of the CMOS inverters in the K FF stages comprise a second PFET and a second NFET coupled in series, wherein the second PFET of at least one of the CMOS inverters has a body terminal coupled to the first control voltage by a first clamping circuit preventing a body diode coupled to the body terminal of the second PFET from being forward biased and the second NFET of the at least one of the CMOS inverters has a body terminal coupled to the second control voltage by a second clamping circuit preventing a body diode coupled to the body terminal of the second NFET from being forward biased.

12. The PLL circuit of claim 11, wherein the first PFET of the transfer gate stage has a body terminal coupled to the first control voltage and the NFET of the transfer gate has a body terminal coupled to the second control voltage.

13. The PLL circuit of claim 12, wherein each of M CMOS inverters comprise a second PFET and a second NFET coupled in series, wherein the second PFET of at least one of the CMOS inverters has a body terminal coupled to the first control voltage by a first clamping circuit preventing a body diode coupled to the body terminal of the second PFET from being forward biased and the second NFET of the at least one of the CMOS inverters has a body terminal coupled to the second control voltage by a second clamping circuit preventing a body diode coupled to the body terminal of the second NFET from being forward biased.

14. The PLL circuit of claim 13, wherein the first clamping circuit comprises a clamping PFET having a body terminal coupled to the source of the second PFET, a gate coupled to ground potential, a drain coupled to the body terminal of the second PFET and a source coupled to the first control voltage and the second clamping circuit comprises a clamping NFET having a body terminal coupled to the source of the second NFET, a gate coupled to the positive power supply voltage, a drain coupled to the body terminal of the second NFET and a source coupled to the first control voltage.

15. The PLL circuit of claim 12, wherein each of M CMOS inverters comprise a third PFET and a third NFET, wherein the third PFET of at least one of the M CMOS inverters has a body terminal coupled to the first control voltage and the third NFET of the at least one of the M CMOS inverters has a body terminal coupled to the second control voltage.

16. The PLL circuit of claim 11, wherein the second control voltage is derived from the first control voltage such that the first and the second control voltages have a same nominal value and opposite slopes when modified.

17. The PLL circuit of claim 11, wherein each of the CMOS inverters in the K FF stages comprise a second PFET and a second NFET coupled in series, wherein the second PFET of at least one of the CMOS inverters has a body terminal coupled to the first control voltage and the second NFET of the at least one of the CMOS inverters has a body terminal coupled to the second control voltage.

18. The PLL circuit of claim 17, wherein each of M CMOS inverters comprises a third PFET and a third NFET, wherein the third PFET of at least one of the M CMOS inverters has a body terminal coupled to the first control voltage and the third NFET of the at least one of the M CMOS inverters has a body terminal coupled to the second control voltage.

19. The PLL circuit of claim 11, wherein the first clamping circuit comprises a clamping PFET having a body terminal coupled to the source of the second PFET, a gate coupled to ground potential, a drain coupled to the body terminal of the second PFET and a source coupled to the first control voltage and the second clamping circuit comprises a clamping NFET having a body terminal coupled to the source of the second NFET, a gate coupled to the positive power supply voltage, a drain coupled to the body terminal of the second NFET and a source coupled to the first control voltage.

20. The PLL circuit of claim 11, wherein K is equal to M.

21. A voltage controlled oscillator (VCO) comprising a ring oscillator having an input, an output, an odd number M of complementary metal oxide semiconductor (CMOS) inverters series coupled between the input and output, a feedback connection between the input and output, and a number K of voltage controlled feed-forward (FF) stages, each of the K FF stages coupled in parallel with K groups of an odd number of G sequential CMOS inverters selected from the M CMOS inverters, each of the K FF stages having a plurality P channel metal oxide silicon transistors (PFETs) and a plurality of N channel metal oxide silicon transistors (NFETs), at least one of the PFETs having a first isolated region of semiconductor material (body) connected to a first body terminal, and at least one of the NFETs having a second isolated body connected to a second body terminal, wherein the K FF stages are controlled by first and second control voltages coupled to the first and second body terminals respectively, wherein each of the K FF stages comprises a CMOS inverter stage coupled in series with a transfer gate stage having a parallel connection of a first PFET and a first NFET, and wherein each of M CMOS inverters comprise a second PFET and a second NFET coupled in series, wherein the second PFET of at least one of the CMOS inverters has a body terminal coupled to the first control voltage by a first clamping circuit preventing a body diode coupled to the body terminal of the second PFET from being forward biased and the second NFET of the at least one of the CMOS inverters has a body terminal coupled to the second control voltage by a second clamping circuit preventing a body diode coupled to the body terminal of the second NFET from being forward biased.

22. The VCO of claim 21, wherein the second control voltage is derived from the first control voltage such that the first and the second control voltages have a same nominal value and opposite slopes when modified.

23. The VCO of claim 21 wherein each of the CMOS inverters in the K FF stages comprise a second PFET and a second NFET coupled in series, wherein the second PFET of at least one of the CMOS inverters has a body terminal coupled to the first control voltage and the second NFET of the at least one of the CMOS inverters has a body terminal coupled to the second control voltage.

24. The VCO of claim 21, wherein each of M CMOS inverters comprise a third PFET and a third NFET, wherein the third PFET of at least one of the M CMOS inverters has a body terminal coupled to the first control voltage and the third NFET of the at least one of the M CMOS inverters has a body terminal coupled to the second control voltage.

25. The VCO of claim 23, wherein each of M CMOS inverters comprise a third PFET and a third NFET, wherein the third PFET of at least one of the M CMOS inverters has a body terminal coupled to the first control voltage and the third NFET of the at least one of the M CMOS inverters has a body terminal coupled to the second control voltage.

26. The VCO of claim 21, wherein each of the CMOS inverters in the K FF stages comprise a second PFET and a second NFET coupled in series, wherein the second PFET of at least one of the CMOS inverters has a body terminal coupled to the first control voltage by a first clamping circuit preventing a body diode coupled to the body terminal of the second PFET from being forward biased and the second NFET of the at least one of the CMOS inverters has a body terminal coupled to the second control voltage by a second clamping circuit preventing a body diode coupled to the body terminal of the second NFET from being forward biased.

27. The VCO of claim 21, wherein the first clamping circuit comprises a clamping PFET having a body terminal coupled to the source of the second PFET, a gate coupled to ground potential, a drain coupled to the body terminal of the second PFET and a source coupled to the first control voltage and the second clamping circuit comprises a clamping NFET having a body terminal coupled to the source of the second NFET, a gate coupled to the positive power supply voltage, a drain coupled to the body terminal of the second NFET and a source coupled to the first control voltage.

28. The VCO of claim 21, wherein the first clamping circuit comprises a clamping PFET having a body terminal coupled to the source of the second PFET, a gate coupled to ground potential, a drain coupled to the body terminal of the second PFET and a source coupled to the first control voltage and the second clamping circuit comprises a clamping NFET having a body terminal coupled to the source of the second NFET, a gate coupled to the positive power supply voltage, a drain coupled to the body terminal of the second NFET and a source coupled to the first control voltage.

29. The VCO of claim 21, wherein K is equal to M.

30. A phase locked loop (PLL) circuit for generating an output clock signal with a frequency that is a multiple number N times the frequency of a reference clock signal, comprising:
   a voltage controlled oscillator (VCO) generating the output clock signal with a frequency modified in response to a control voltage;
   a frequency divider for frequency dividing the output clock signal by N, generating a frequency divided clock signal;
   a phase frequency detector for comparing the frequency divided clock signal to the reference clock signal and generating a phase/frequency error signal; and
   circuitry for converting the phase/frequency error signal to the control voltage, the VCO is configured as a ring oscillator having an input, an output, an odd number M of complementary metal oxide semiconductor (CMOS) inverters series coupled between the input and output, a feedback connection between the input and output, and a number K of voltage controlled feed-forward (FF) stages, each of the K FF stages coupled in parallel with K groups of an odd number of G sequential CMOS inverters selected from the M CMOS inverters, each of the K FF stages having a plurality P channel metal oxide silicon transistors (PFETs) and a plurality of N channel metal oxide silicon transistors (NFETs), at least one of the PFETs having a first isolated region of semiconductor material (body) connected to a first body terminal, and at least one of the NFETs having a second isolated body connected to a second body terminal, wherein the K FF stages are controlled by first and second control voltages coupled to the first and second body terminals respectively,
   wherein each of the K FF stages comprise a CMOS inverter stage coupled in series with a transfer gate stage having a parallel connection of a first PFET and a first NFET,
   wherein the first PFET of the transfer gate stage has a body terminal coupled to the first control voltage and the NFET of the transfer gate has a body terminal coupled to the second control voltage, and
   wherein each of the CMOS inverters in the K FF stages comprise a second PFET and a second NFET coupled in series, wherein the second PFET of at least one of the CMOS inverters has a body terminal coupled to the first control voltage by a first clamping circuit preventing a body diode coupled to the body terminal of the second PFET from being forward biased and the second NFET of the at least one of the CMOS inverters has a body terminal coupled to the second control voltage by a second clamping circuit preventing a body diode coupled to the body terminal of the second NFET from being forward biased.

31. The PLL of claim 30, wherein the second control voltage is derived from the first control voltage such that the first and the second control voltages have a same nominal value and opposite slopes when modified.

32. The PLL of claim 30 wherein each of the CMOS inverters in the K FF stages comprise a second PFET and a second NFET coupled in series, wherein the second PFET of at least one of the CMOS inverters has a body terminal coupled to the first control voltage and the second NFET of the at least one of the CMOS inverters has a body terminal coupled to the second control voltage.

33. The PLL of claim 30, wherein each of M CMOS inverters comprise a third PFET and a third NFET, wherein the third PFET of at least one of the M CMOS inverters has a body terminal coupled to the first control voltage and the third NFET of the at least one of the M CMOS inverters has a body terminal coupled to the second control voltage.

34. The PLL of claim 32, wherein each of M CMOS inverters comprise a third PFET and a third NFET, wherein the third PFET of at least one of the M CMOS inverters has a body terminal coupled to the first control voltage and the third NFET of the at least one of the M CMOS inverters has a body terminal coupled to the second control voltage.

35. The PLL of claim 30, wherein each of the CMOS inverters in the K FF stages comprise a second PFET and a second NFET coupled in series, wherein the second PFET of at least one of the CMOS inverters has a body terminal coupled to the first control voltage by a first clamping circuit preventing a body diode coupled to the body terminal of the second PFET from being forward biased and the second NFET of the at least one of the CMOS inverters has a body terminal coupled to the second control voltage by a second clamping circuit preventing a body diode coupled to the body terminal of the second NFET from being forward biased.

36. The PLL of claim 30, wherein each of M CMOS inverters comprise a second PFET and a second NFET coupled in series, wherein the second PFET of at least one of the CMOS inverters has a body terminal coupled to the first control voltage by a first clamping circuit preventing a body diode coupled to the body terminal of the second PFET from being forward biased and the second NFET of the at least one of the CMOS inverters has a body terminal coupled to the second control voltage by a second clamping circuit preventing a body diode coupled to the body terminal of the second NFET from being forward biased.

37. The PLL of claim 35, wherein the first clamping circuit comprises a clamping PFET having a body terminal coupled to the source of the second PFET, a gate coupled to ground potential, a drain coupled to the body terminal of the second PFET and a source coupled to the first control voltage and the second clamping circuit comprises a clamping NFET having a body terminal coupled to the source of the second NFET, a gate coupled to the positive power supply voltage, a drain coupled to the body terminal of the second NFET and a source coupled to the first control voltage.

38. The PLL of claim 30, wherein the first clamping circuit comprises a clamping PFET having a body terminal coupled to the source of the second PFET, a gate coupled to ground potential, a drain coupled to the body terminal of the second PFET and a source coupled to the first control voltage and the second clamping circuit comprises a clamping NFET having a body terminal coupled to the source of the second NFET, a gate coupled to the positive power supply voltage, a drain coupled to the body terminal of the second NFET and a source coupled to the first control voltage.

39. The PLL of claim 30, wherein K is equal to M.

* * * * *